(12) United States Patent
Bolognia et al.

(10) Patent No.: US 6,373,696 B1
(45) Date of Patent: *Apr. 16, 2002

(54) HARD DRIVE COOLING USING FINNED HEAT SINK AND THERMALLY CONDUCTIVE INTERFACE PAD

(75) Inventors: David F. Bolognia, Kingwood; Ghassan R. Gebara, Spring, both of TX (US)

(73) Assignee: Compaq Computer Corporation, Houston, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/094,885

(22) Filed: Jun. 15, 1998

(51) Int. Cl.[7] .............................. G06F 1/20; H05K 7/20
(52) U.S. Cl. ...................... 361/687; 361/685; 361/709
(58) Field of Search ................. 361/688, 687, 361/685, 697, 703, 709, 704, 707, 715, 710; 165/80.3; 257/718, 719, 726, 727; 174/16.3; 161/80.2, 80.3

(56) References Cited

U.S. PATENT DOCUMENTS

| | | | |
|---|---|---|---|
| 4,377,315 A | 3/1983 | Grau | 339/17 R |
| 4,530,615 A | 7/1985 | Katsuura et al. | 403/16 |
| 4,537,454 A | 8/1985 | Douty et al. | 339/45 M |
| 4,550,362 A | 10/1985 | Reimer | 361/415 |
| 4,574,332 A | 3/1986 | Calabro | 361/413 |
| 4,579,478 A | 4/1986 | Takahashi | 403/405.1 |
| 4,692,571 A | 9/1987 | Trinh et al. | 200/5 A |
| 4,694,380 A | 9/1987 | Mallory et al. | 361/424 |
| 4,742,608 A | 5/1988 | M'Sadoques et al. | 29/453 |
| 4,849,944 A | 7/1989 | Matsushita | 371/21 |
| 4,894,739 A | 1/1990 | Kobayashi | 360/97.02 |
| 4,896,777 A | 1/1990 | Lewis | 211/41 |
| 4,941,841 A | 7/1990 | Darden et al. | 439/377 |
| 4,979,909 A | 12/1990 | Andrews | 439/352 |
| 5,003,431 A | 3/1991 | Imsdahl | 361/415 |
| 5,187,643 A | 2/1993 | I-Shou | 361/391 |
| 5,233,594 A | * 8/1993 | Wilhelm | 369/75.1 |

(List continued on next page.)

FOREIGN PATENT DOCUMENTS

| | | |
|---|---|---|
| CA | 1123503 | 5/1982 |
| EP | 0029484 | 7/1980 |
| EP | 0278358 | 8/1988 |
| EP | 0349285 | 1/1990 |
| EP | 0425175 | 5/1991 |
| EP | 0428294 | 5/1991 |
| EP | 0488679 | 6/1992 |
| FR | 2649854 | 7/1989 |

OTHER PUBLICATIONS

IBM Technical Disclosure Bulletin, vol. 33, No. 12, May, 1991, "Removable Tray Assembly", pp. 178–183.
Patent Abstracts of Japan, vol. 13, No. 435 (E–825), Sep. 28, 1989.

*Primary Examiner*—Lynn D. Feild

(57) ABSTRACT

A hot-pluggable disk drive is supported on a carrier structure which is slidably and removably insertable rearwardly into a sheet metal cage portion of a computer system in a manner releasably coupling an SCA connector on a rear end of the drive to a corresponding electrical connector on a backplane structure within a rear interior portion of the cage. Heat generated by the operation of the disk drive is removed by forced convection via a flow of air forced through the cage by a suitable cooling fan. This convective cooling is conductively augmented by a pair of finned metal heat sink portions of the carrier which are movably carried by a base wall portion thereof, clamped against opposite sides of the supported disk drive, and positioned in the cooling air flow through the cage. Resilient thermal interface pad members are compressed between the finned heat sinks to improve the efficiency of heat conduction from the disk drive sides to the heat sinks.

34 Claims, 13 Drawing Sheets

U.S. PATENT DOCUMENTS

| | | | |
|---|---|---|---|
| 5,277,615 A | | 1/1994 | Hastings et al. .............. 439/377 |
| 5,285,347 A | * | 2/1994 | Fox et al. .................... 361/685 |
| 5,340,340 A | * | 8/1994 | Hastings et al. ............... 439/64 |
| 5,463,527 A | | 10/1995 | Hager et al. ................. 361/685 |
| 5,548,480 A | | 8/1996 | Rudi et al. ................... 361/685 |
| 5,664,624 A | * | 9/1997 | Tsai et al. ................... 165/80.3 |
| 5,673,171 A | | 9/1997 | Varghese et al. ............. 361/685 |
| 5,870,286 A | * | 2/1999 | Butterbaugh et al. ........ 361/704 |
| 5,927,386 A | * | 7/1999 | Lin ............................ 165/80.3 |
| 6,069,792 A | * | 5/2000 | Nelik .......................... 361/687 |
| 6,084,768 A | * | 7/2000 | Bolognia ..................... 361/685 |
| 6,088,221 A | * | 7/2000 | Bolognia ..................... 361/685 |

* cited by examiner

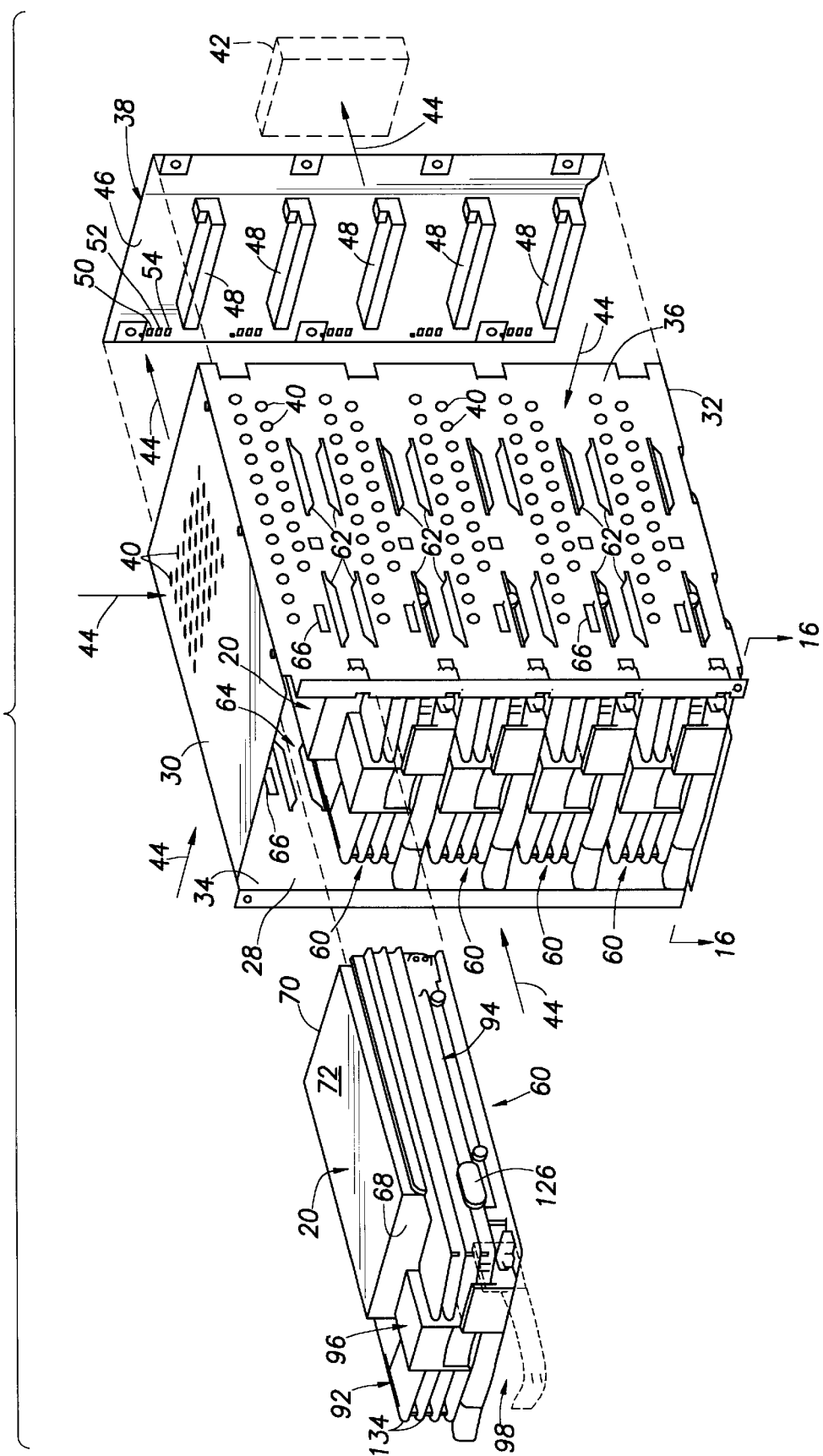

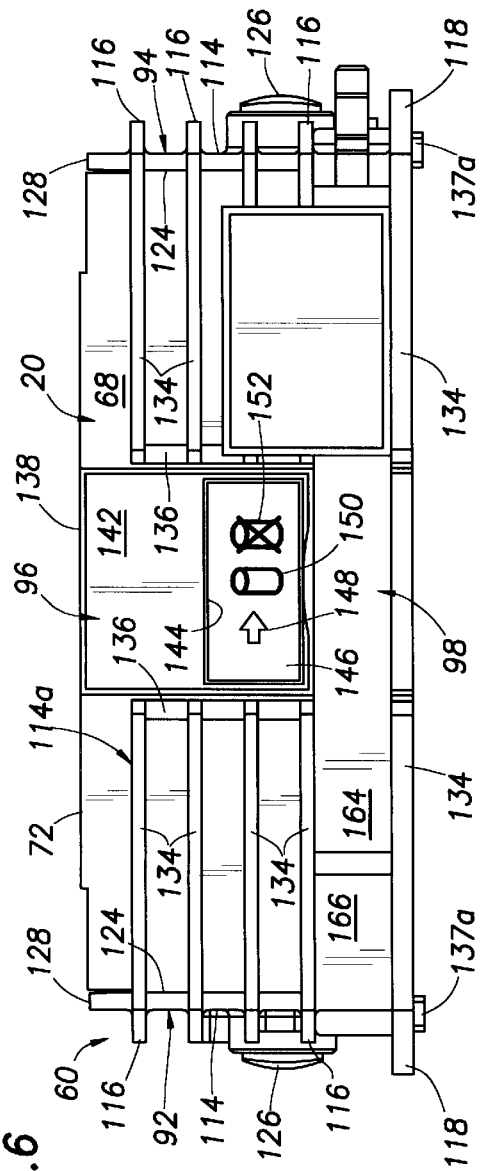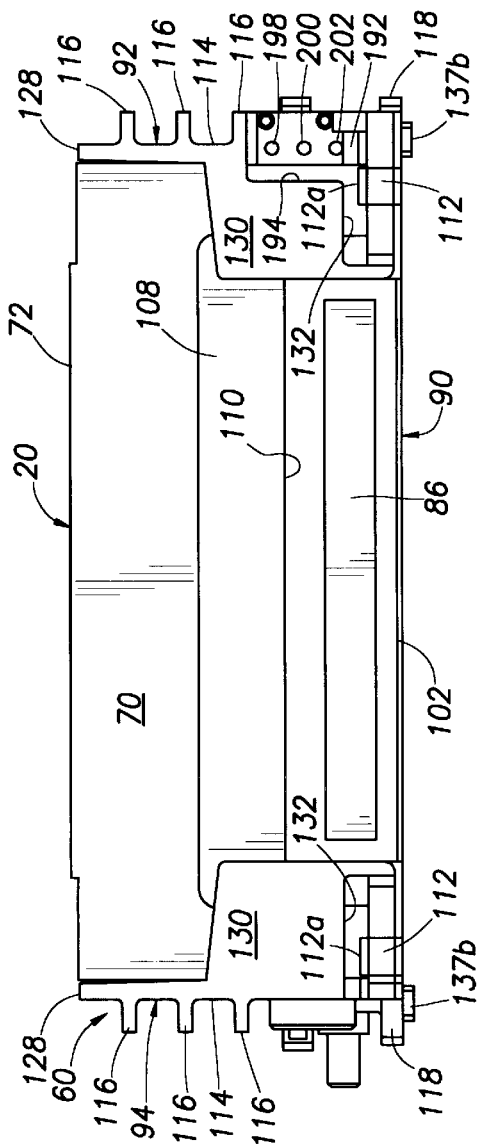

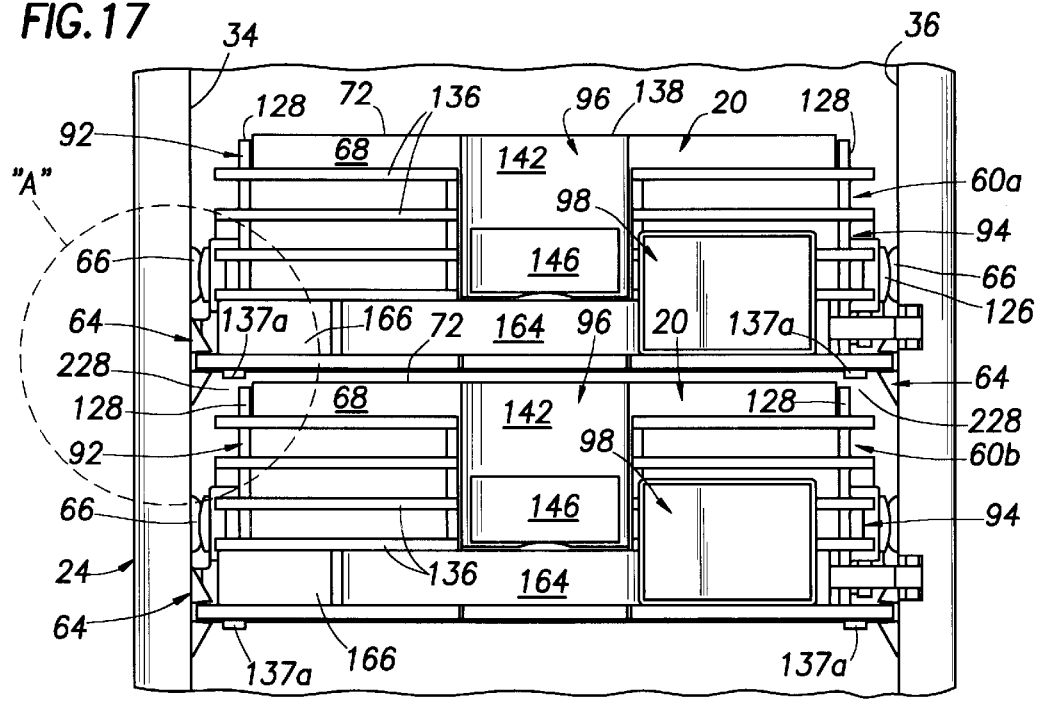
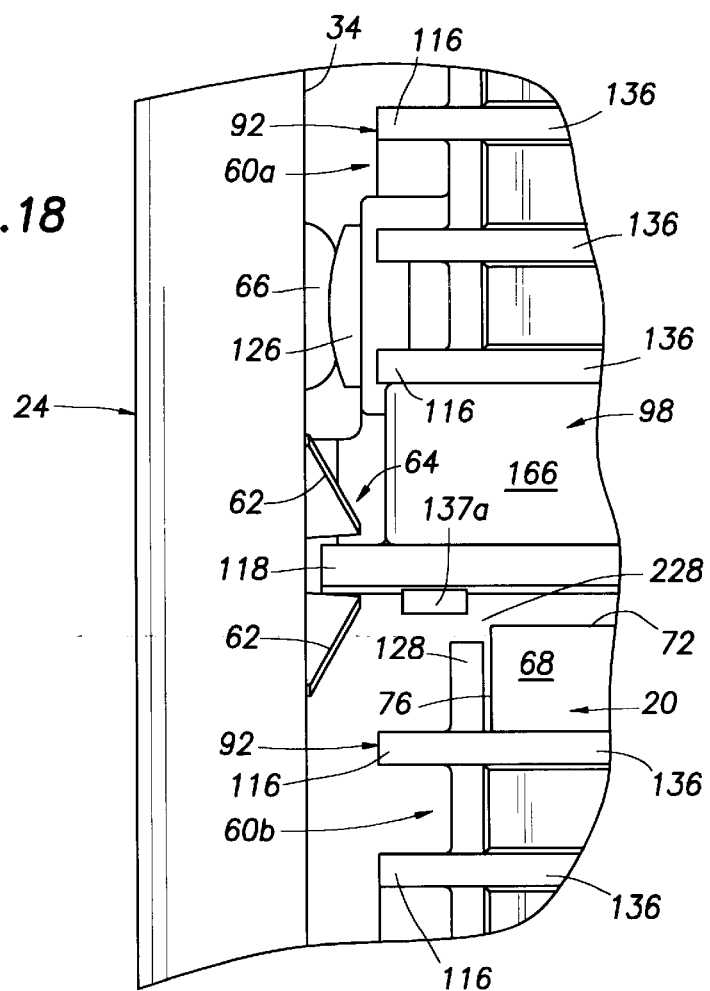

HARD DRIVE COOLING USING FINNED HEAT SINK AND THERMALLY CONDUCTIVE INTERFACE PAD

BACKGROUND OF THE INVENTION

1. Field of the Invention

The present invention generally relates to the mounting and support of hard disk drives for computers and, in a preferred embodiment thereof, more particularly relates to apparatus for removably supporting a plurality of hot plug-connected hard disk drives.

2. Description of Related Art

Hard disk drives for a file server or other type of computer are often mounted, in a vertically or horizontally stacked array, in a rectangular sheet metal "cage" structure which may be disposed within the computer housing or externally thereto. For operational convenience and flexibility, each disk drive is typically "hot plug" connected within the cage. This type of electrical connection permits any of the supported disk drives to be removed and re-installed within the cage without disturbing the operation of the other disk drives.

To effect this desirable hot plug connection of each of the disk drives, each disk drive is typically supported on a carrier structure which is slidably and removably insertable into the cage to mate an electrical connector carried on a rear portion of the drive or its carrier structure with a corresponding electrical connector on a back plane circuit board suitably supported at the rear interior side of the cage.

As might be imagined, a closely grouped array of hard drives of this sort can generate a substantial amount of operating heat. Such operating heat must, of course, be appropriately dissipated in order to prevent damage to the drives and their associated electronic circuitry. The traditional approach to this heat dissipation task has been to use one or more cooling fans to flow air across the drives to convectively cool them. With older, relatively slow speed disk drives, this convective cooling approach has been generally satisfactory. However, with modern higher speed disk drives (having spin rates in the 10,000–12,000 RPM range) forced convective cooling by itself is declining in effectiveness as the amount of air fans can efficiently move through limited cage spaces is limited.

Due to this diminishing effectiveness of convection-only cooling of carrier-mounted hard disk drives, recent proposals have been made to add conduction to the cooling arsenal. This has been done primarily by screwing the drives directly to metal portions of their associated carriers. This technique has proven to only marginally lower the operating temperatures of the supported disk drives and only minimally reduces the forced convection cooling requirements of the overall system.

In view of the foregoing it can be seen that, in the area of carrier supported hot-pluggable hard disk drives, a need exists for improved heat dissipation techniques. It is to this need that the present invention is directed.

SUMMARY OF THE INVENTION

In carrying out principles of the present invention, in accordance with a preferred embodiment thereof, a computer system is provided which includes a CPU unit having a microprocessor and a data storage section operative to store data retrievable by the microprocessor. The data storage section includes a housing structure in which a stacked series of data storage devices, illustratively hot-pluggable hard disk drives, are removably supported using specially designed heat dissipating carrier structures upon which the individual disk drives are mounted. The carrier structures function to efficiently dissipate, to cooling air being flowed through the housing structure, operating heat generated by the disk drives.

Each carrier structure, which may be configured to support a heat-generating electronic device other than a hard disk drive, basically comprises a body configured to support the disk drive and being removably insertable into the housing structure to a supported operating position therein. The body has a thermally conductive heat sink portion positionable in the path of cooling air flowing through the support housing and being movable toward and away from the body-supported disk drive.

A resilient, heat conductive thermal interface structure is provided and is positionable between the supported disk drive and the movable heat sink portion of the body. The carrier structure further includes a fastening structure operative to removably secure the heat sink portion to the supported disk drive, in a manner compressing the resilient interface structure between the heat sink portion and the disk drive, to conductively receive operating heat from the disk drive for dissipation from the heat sink portion to cooling air being flowed through the housing structure.

In a preferred embodiment of the carrier structure, it includes a base wall upon which the disk drive may be placed, and the movable heat sink portion includes a pair of finned heat sink side walls which have front ends pivotally connected to a front end portion of the base wall, and rear ends coupled to a rear end portion of the base wall in a manner limiting the pivotal movement of these heat sink side walls toward and away from the disk drive disposed therebetween on the base wall.

Preferably, the thermal interface structure includes a pair of resilient, heat conductive thermal interface pads which are secured to facing side surfaces of the heat sink side walls. The fastening structure illustratively includes threaded fastening members captively retained on the heat sink side walls and being releasably securable to opposite sides of the disk drive to releasably mount it on the carrier structure and compress the thermal interface pads between the heat sink side walls and opposite side surface portions of the disk drive.

When the disk drives are operatively mounted in the housing structure, operating heat from each disk drive is conductively transferred through its thermal interface pads to the associated finned heat sink walls on opposite sides of the disk drive for convective dissipation to cooling air being flowed through the support housing. To increase such convective heat transfer, front end portions of the heat sink side walls on each carrier structure are defined by spaced apart fin members that extend in side-to-side directions and form therebetween cooling air flow passages positioned adjacent the front end of the supported disk drive. The carrier structures thus function to operatively support the disk drives in the housing structure and also provide for the disk drives an enhanced level of operating heat dissipation.

BRIEF DESCRIPTION OF THE DRAWINGS

FIG. 2 is a simplified, partially exploded perspective view of the cage structure and the plurality of disk drive/carrier assemblies operatively supported therein and hot plug-connected to backplane electrical connectors therein, with one of the disk drive/carrier assemblies having been removed from the cage structure;

FIG. 6 is an enlarged scale front end elevational view of the removed disk drive/carrier assembly;

FIG. 7 is an enlarged scale rear end elevational view of the removed disk drive/carrier assembly;

FIGS. 11–13 are enlarged scale top, front and left side perspective views of the removed disk drive/carrier assembly, with a latch portion thereof respectively being in closed, partially opened, and fully opened positions thereof;

FIGS. 11A–13A are enlarged scale partial cross-sectional views through the removed disk drive/carrier assembly respectively taken along lines 11A—11A, 12A—12A and 13A—13A of FIGS. 11–13;

FIG. 17 is an enlarged scale front side elevational view of the cage structure and illustrates two of the disk drive/carrier assemblies supported and hot plug-connected therein; and FIG. 18 is an enlarged scale detail view of the dashed circled area "A" in FIG. 17.

DETAILED DESCRIPTION

Figure 1:
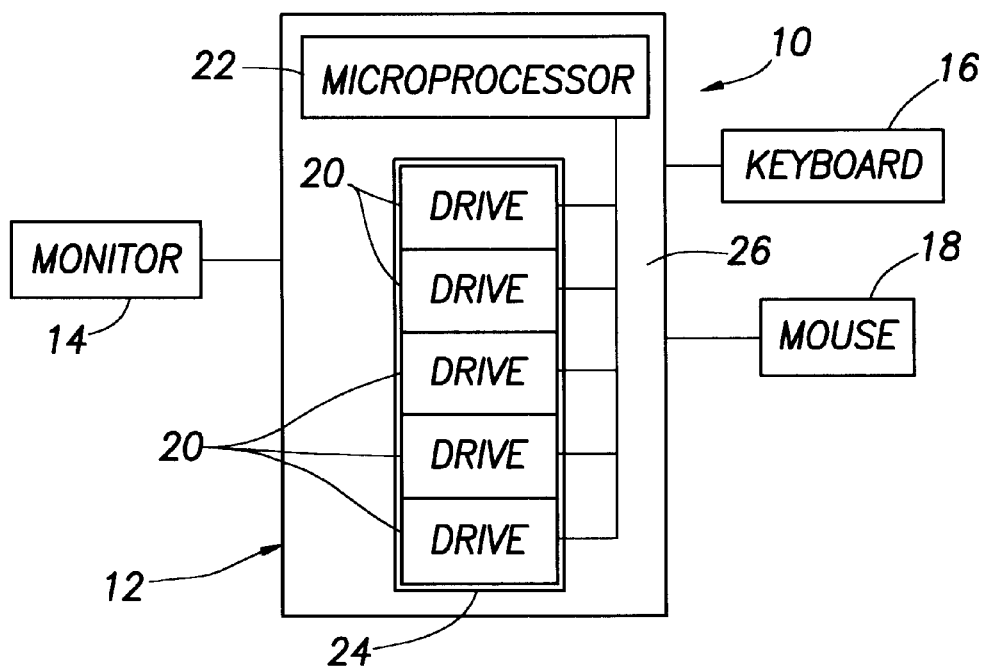
FIG. 1 is a schematic diagram of a representative computer system having incorporated therein a stacked hard disk drive/carrier array supported in a cage structure and embodying principles of the present invention.
Figure 3:
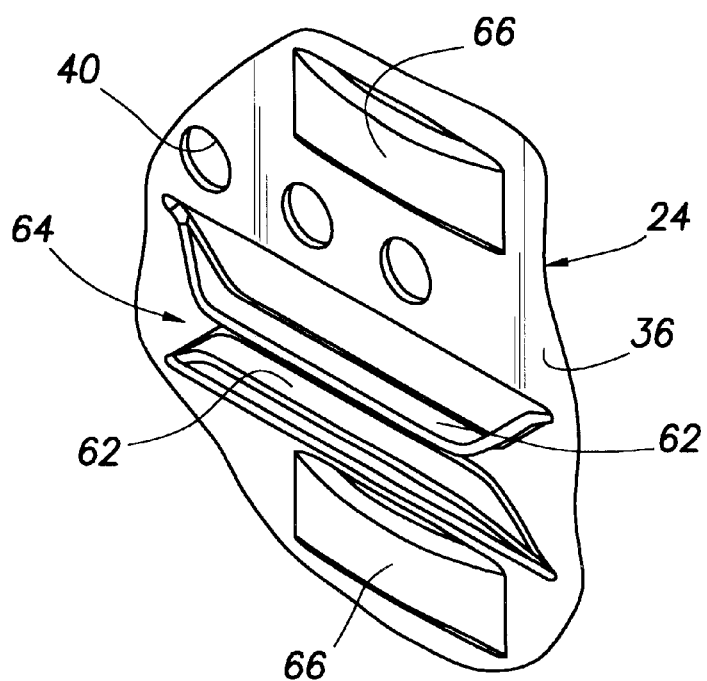
FIG. 3 is an enlarged scale perspective detail view of an inner side portion of one of the vertical side walls of the cage structure.
Figure 4:
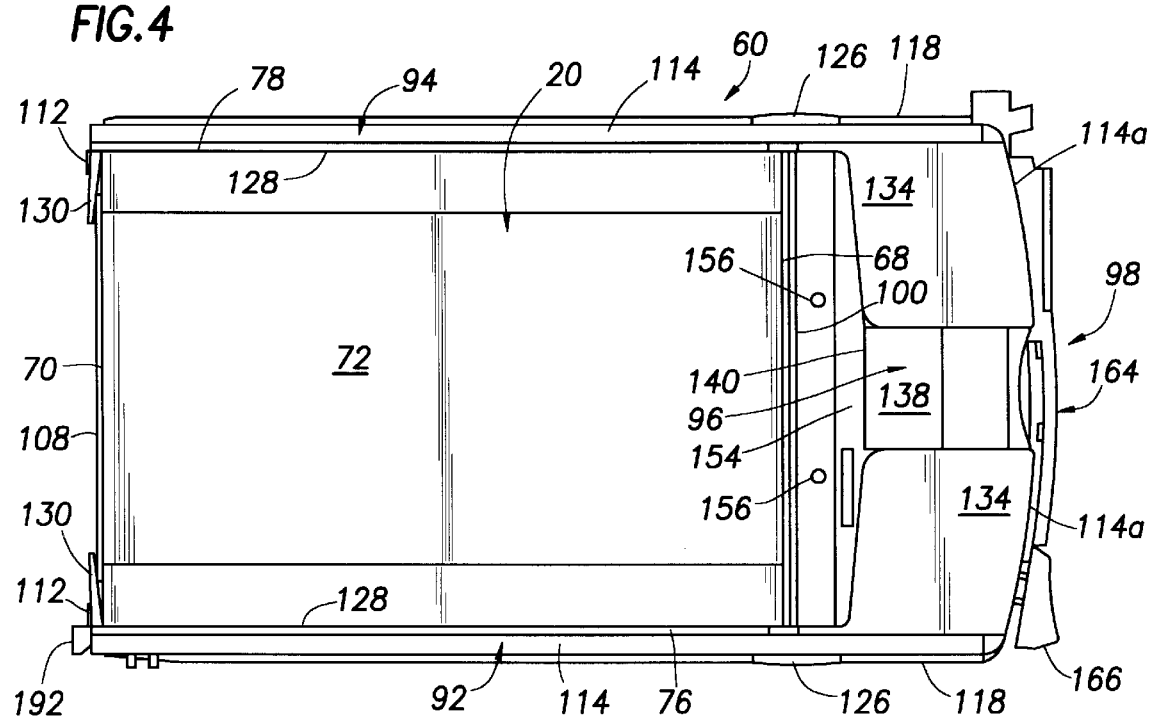
FIG. 4 is an enlarged scale top plan view of the removed disk drive/carrier assembly.
Figure 5:
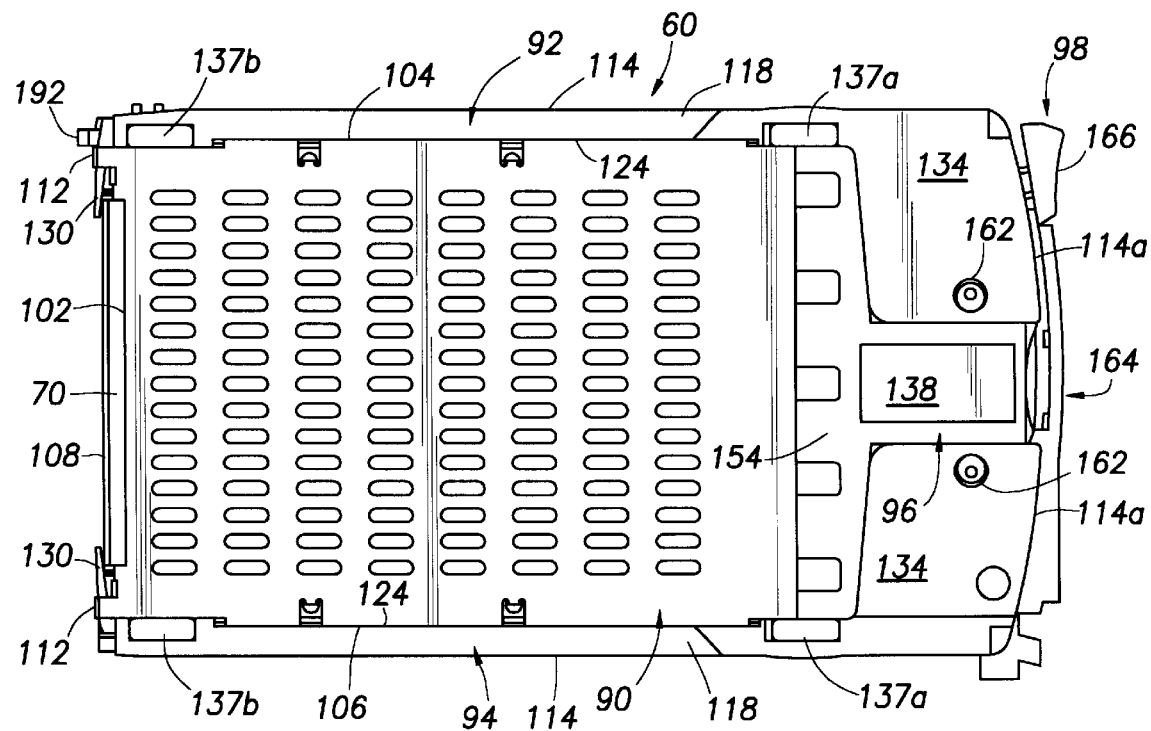
FIG. 5 is an enlarged scale bottom plan view of the removed disk drive/carrier assembly.
Figure 8:
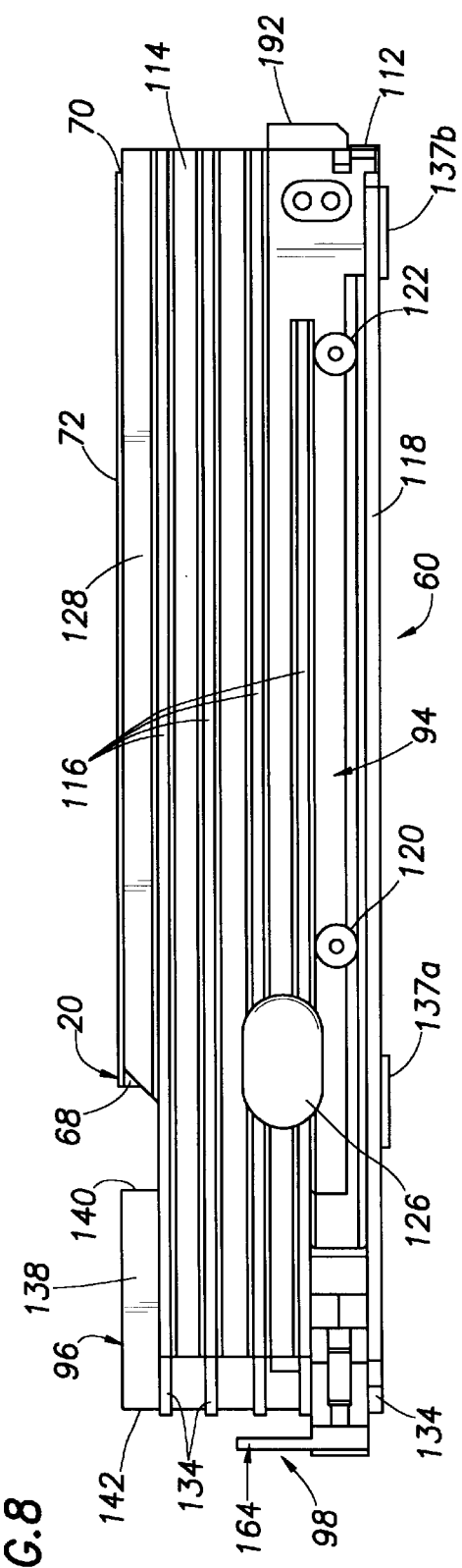
FIG. 8 is an enlarged scale right side elevational view of the removed disk drive/carrier assembly.
Figure 9:
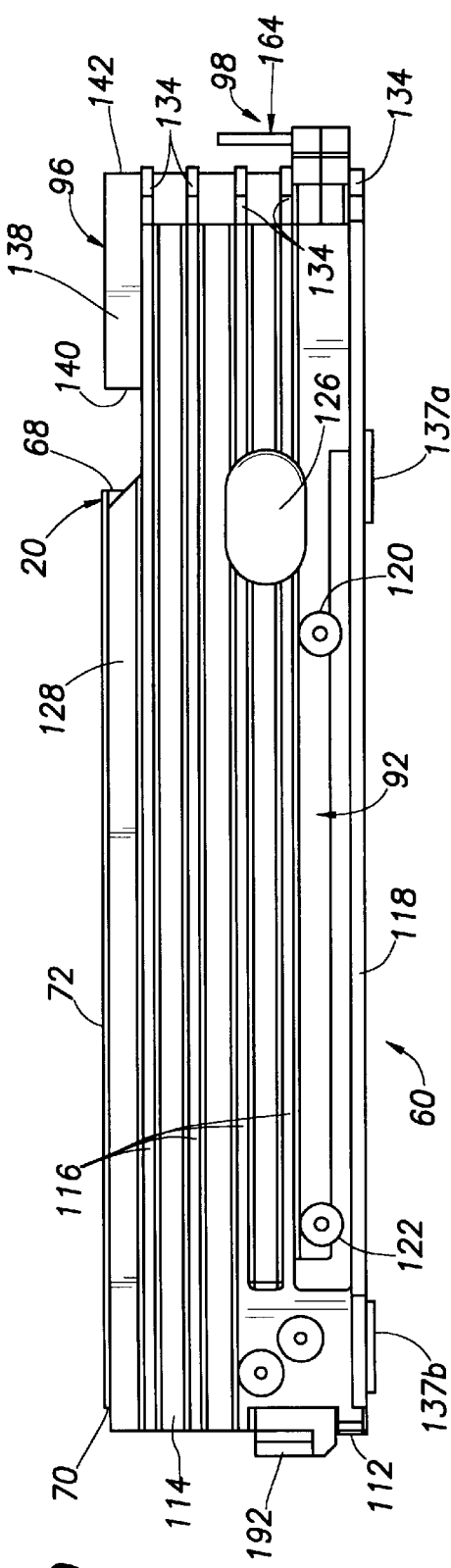
FIG. 9 is an enlarged scale left side elevational view of the removed disk drive/carrier assembly.

Schematically illustrated in FIG. 1 is a representative computer system 10, the components of which are interconnected as shown and include a computer, illustratively in the form of a tower type CPU unit 12; a monitor 14; a keyboard 16; and a pointing device, representatively in the form of a mouse 18. In addition to various other components disposed therein, the CPU unit 12 has a data storage section, representatively a vertically stacked series of hard disk drives 20, operative to store data that may be retrieved by a microprocessor 22 within the CPU unit 12.

In the illustrated embodiment of the CPU unit 12, the vertically stacked series of hard disk drives 20 are removably positioned within a support housing, representatively in the form of a sheet metal cage structure 24 positioned within the outer housing 26 of the CPU unit 12, using specially designed carrier apparatus embodying principles of the present invention and subsequently described herein. Alternatively, the cage structure 24 could be located externally of the CPU housing 26 within a separate rack housing (not shown). Moreover, while the disk drives 20 have been representatively illustrated as being vertically stacked, they could also be positioned in a horizontally stacked array in which the cage 24 was rotated ninety degrees to one side instead of being vertically oriented.

The data storage section of the computer system 10, with its vertically stacked array of hard disk drives 20 (representatively five in number), is shown in simplified, partially exploded perspective form in FIG. 2. As illustrated, the sheet metal cage structure 24 functions as a support housing and representatively is of a vertically elongated rectangular configuration, having an open front side 28, top and bottom walls 30 and 32, left and right vertical side walls 34 and 36, and a backplane structure 38 extending along its rear side. Ventilation holes 40 are formed in the top, left and right cage walls 30,34 and 36, and a schematically illustrated fan 42 is operatively disposed behind the backplane structure 38 within the computer housing 26. During operation of the CPU unit 12, the fan 42 draws cooling air 44 into the interior of the cage structure 24 through its open front side 28 and its ventilation holes 40, flows the air 44 along the disk drives 20 supported within the cage 24, and then discharges the air outwardly through the rear of the cage 24 around the periphery of the backplane structure 38.

The backplane structure 38 has a vertically elongated rectangular configuration, with a front side 46 from which a vertically spaced array of five male electrical connectors 48 (one for each of the five disk drives 20) forwardly project. To the left of each of the connectors 48 are three vertically stacked LED indicating lights 50,52 and 54. As later described herein, these indicating lights are used to provide a visual indicia as to the operating state of each of the hard disk drives 20.

Each of the disk drives 20 is supported on a specially designed carrier structure 60 which is used, as later described herein, to removably support the disk drives 20 within the cage 24 in a manner creating a hot plug connection for each drive to one of the backplane connectors 48. To facilitate the removable support within the cage 24 of each of the carriers, portions 62 of the vertical left and right side walls 34,36 of the cage 24 are lanced inwardly to form for each carrier 60 a pair of front and rear guide rail sections 64 on each of the left and right cage side walls 34 and 36 (see FIGS. 3 and 16–18), with each of the guide rail sections 64 being defined by vertically facing pairs of the lanced-in cage wall portions 62. For purposes later described herein, directly above each front pair of lanced-in wall portions 62 is an arcuate lanced-in wall portion 66.

Each disk drive 20 (see FIGS. 10 and 15) has a generally rectangular configuration which is elongated in a front-to-rear direction, and further has front and rear end walls 68 and 70, top and bottom side walls 72 and 74, and left and right vertical side walls 76 and 78. In each of the left and right side walls 76,78 a pair of threaded mounting holes 80,82 are formed near the bottom side of the disk drive respectively adjacent respectively adjacent its front and rear ends A circuit board 84 is operatively mounted on the bottom side of the disk drive 20, and is electrically coupled thereto. The circuit board 84, which forms a portion of the overall disk drive structure, has a female SCA connector 86 thereon which is centrally positioned at the rear end wall 70 of the disk drive and is releasably mateable, in a hot-plug manner, with a corresponding one of the backplane connectors 48 (see FIGS. 2 and 16) in response to operative insertion of the disk drive 20 into the cage 24 as later described herein.

Structure of the Carriers 60

The carrier structures 60 are used to support the hard disk drives 20 for removable sliding insertion into the interior cage 24 to supported operating positions in which the disk drives are releasably hot-plugged to the backplane connectors 48 received in the SCA connectors 86 of the inserted disk drives 20. Each carrier structure 60 is of a unitary, no loose parts construction comprised of several components that are captively retained on one another so that none of the components can be separated from the structure and become misplaced, lost or easily damaged.

More specifically, and with reference now to FIGS. 4–18, each of the disk drive carriers 60 (see, in particular, FIGS. 10, 14 and 15) includes a perforated sheet metal bottom or base wall 90; left and right metal side wall heat sink structures 92 and 94; a molded plastic front bezel structure 96; and a molded plastic ejector latch assembly 98.

Base wall 90 has front and rear end edges 100 and 102, left and right side edges 104 and 106, and an upturned rear end flange 108 having a rectangular opening 110 therein. For purposes later described herein, at the opposite rear corners of the base wall 90 are upturned rear edge tabs 112.

Each of the left and right metal side wall heat sink structures 92 and 94 extends upwardly from its associated base wall 90 and has a relatively thin rectangular body section 114 which is horizontally elongated in a front-to-rear direction relative to the base wall 90 and is positioned adjacent one of the left and right base wall side edges 104,106. The outer sides of the left and right side body sections 114 have formed thereon vertically spaced pluralities of elongated heat sink fin projections 116 that longitudinally extend in front-to-rear directions.

Along the bottom side edge of each of the left and right side walls 92,94 is an outwardly projecting mounting flange 118 which is slidingly receivable in the previously mentioned cage guide rail sections 64 to mount the carrier 60 (and thus the disk drive 20 which it supports) within the cage 24. Front and rear disk drive mounting screws 120,122 are captively retained on each of the body sections 114 and extend therethrough from their outer sides to their inner sides 124. For purposes later described herein, just forwardly of the front mounting screws 120 are a pair of outwardly projecting boss structures 126 formed on the outer sides of the left and right carrier side wall body sections 114. Additionally, flanges 128, elongated in a front-to-rear directions, are formed on the top side edges of the body sections 114.

At the rear end of each of the side wall body sections 114 is an inturned tab 130 having a horizontal slot 132 formed therein. Top end portions 112a of the upturned base wall rear corner tabs 112 are slidingly received in the slots 132 which are substantially wider in left-to-right directions than the corresponding widths of the top tab end portions 112a. The side wall body sections 114 have inturned transverse front end portions 114a each defined by a vertically spaced series of separated heat sink fins 134 joined at their inner ends by a vertical bar member 136.

Front and rear resilient shock isolation feet 137a,137b (see FIGS. 5–9) are suitably secured to the underside of each of the side wall body sections 114 and project downwardly beyond its bottom side surface. Feet 137a,137b have rectangular configurations which are elongated in front-to-rear directions, with the feet 137a being positioned adjacent the junctures of the body sections 114 and their associated transverse front end portions, and the feet 137b being positioned adjacent the rear ends of the body sections 114.

The molded plastic bezel structure 96 (see FIGS. 5, 6, 10 and 14) is positioned at the front end of the carrier 60 and has a hollow rectangular central section 138 with an open rear side 140 and a front wall 142 with a rectangular opening 144 therein. A translucent plastic plate member 146 with disk operating icons 148,150,152 thereon is received in the opening 144. At the rear side of the central bezel section 138 is a bottom base plate portion 154 of the bezel which is elongated in left and right directions and underlies a front end edge portion of the metal carrier base wall 90. A spaced series of posts extend upwardly from the bezel base plate portion 154 through corresponding holes in the metal carrier base plate 90 and are heat staked thereto as at 156.

Hollow bosses 158,160 (see FIG. 11A) are respectively formed on left and right sides of the central bezel section 138 and are respectively received between the two lowermost heat sink fins 134 on the transverse front end portions 114a of the left and right heat sink walls 92,94 of the carrier 60. Shouldered screws 162 extend vertically through the front end portions 114a, and the bosses 158,160, and secure the front end portions 114a to the bezel 96 for pivotal motion relative thereto about vertical axes extending through the bosses 158,160.

The ejector latch assembly 98 (see FIGS. 11–13A) includes an elongated molded plastic ejector lever member 164; a molded plastic retainer slide member 166; and a molded plastic bifurcated spring member 168. The ejector lever member 164 has an inner end portion 170 with an inner side recess 172 formed therein, and a generally transverse, rearwardly inturned outer end portion 174 having an outer side notch 176 disposed at its juncture with the balance of the lever member. The retainer slide member 166 is formed integrally with an elongated spring arm structure 178 which, in turn, is formed integrally with a left side of the central bezel section 138 and extends between the two lowermost heat sink fins 134 on the left front corner of the carrier 60. As illustrated, the retainer slide member 166 is exposed on a left front side portion of the carrier 60.

The bifurcated spring member 168 has an elongated inner side arm 180, an elongated outer side arm 182 with a rounded projection 184 at its outer end, and an inner end portion 186 with a notch 188 formed therein. Inner end portions of the ejector lever 164 and the bifurcated spring member 168 are positioned between the two lowermost heat sink fins 134 on a right front corner portion of the carrier 60 and are pivotally secured to such heat sink fins 134 by a vertically extending shouldered screw 190. The spring member 168 is pivotable relative to the lever member 164 in a manner such that the outer side arm 182 can swing into and out of the lever side recess 172, and the outer end of the inner side arm 180 is forwardly adjacent the boss 160. As illustrated, the notched inner end portion 186 of the ejector lever member 164 projects outwardly beyond a right front corner portion of the carrier 60 in a rightward direction.

Figure 14:
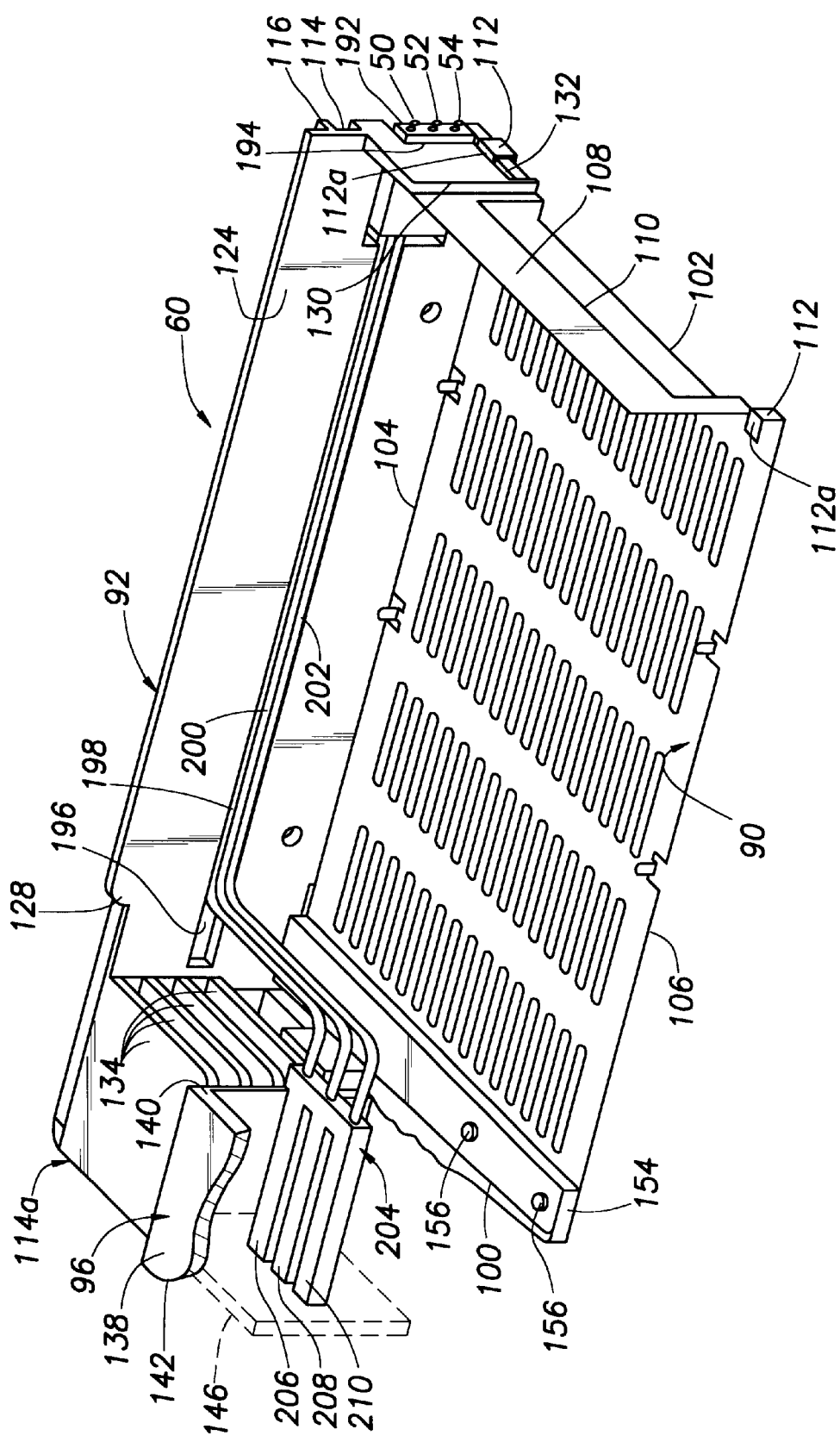
FIG. 14 is an enlarged scale, partially cut away perspective view of part of the carrier portion of the removed assembly and illustrates a fiber optic cable-based LED indicating light transfer structure integrally incorporated into the carrier.

Turning now to FIG. 14, a rearwardly facing exposed optical connector 192 is suitably mounted on the left rear corner of the carrier 60 in a cutout area 194 of the left inturned side wall tab 130. The connector 192 extends forwardly through the cutout area 194 into a vertically enlarged portion of a horizontally elongated groove 196 formed in the inner side surface 124 of the body section 114 of the left heat sink side wall 92. Three fiber optic cables 198,200,202 are operatively coupled at rear ends thereof to the connector 192 and longitudinally extend therefrom through the groove 196 to adjacent its front end near the front end section 114a of the left side wall heat sink structure 92. At this point the fiber optic cables 198,200,202 turn rightwardly to a location directly behind the open rear side 140 of the central bezel section 138. The cables then turn forwardly and connect to a lens structure 204 disposed within the interior of the central bezel section 138. Lens structure 204 has three spaced apart, forwardly projecting sections 206,208,210 which are respectively associated with the front ends of the fiber optic cables 198,200,202. The lens sections 206,208,210 have front ends which are located behind the plastic plate member 145 and respectively aligned with the drive operating icons 148,150,152 thereon (see FIG. 6).

Figure 10:
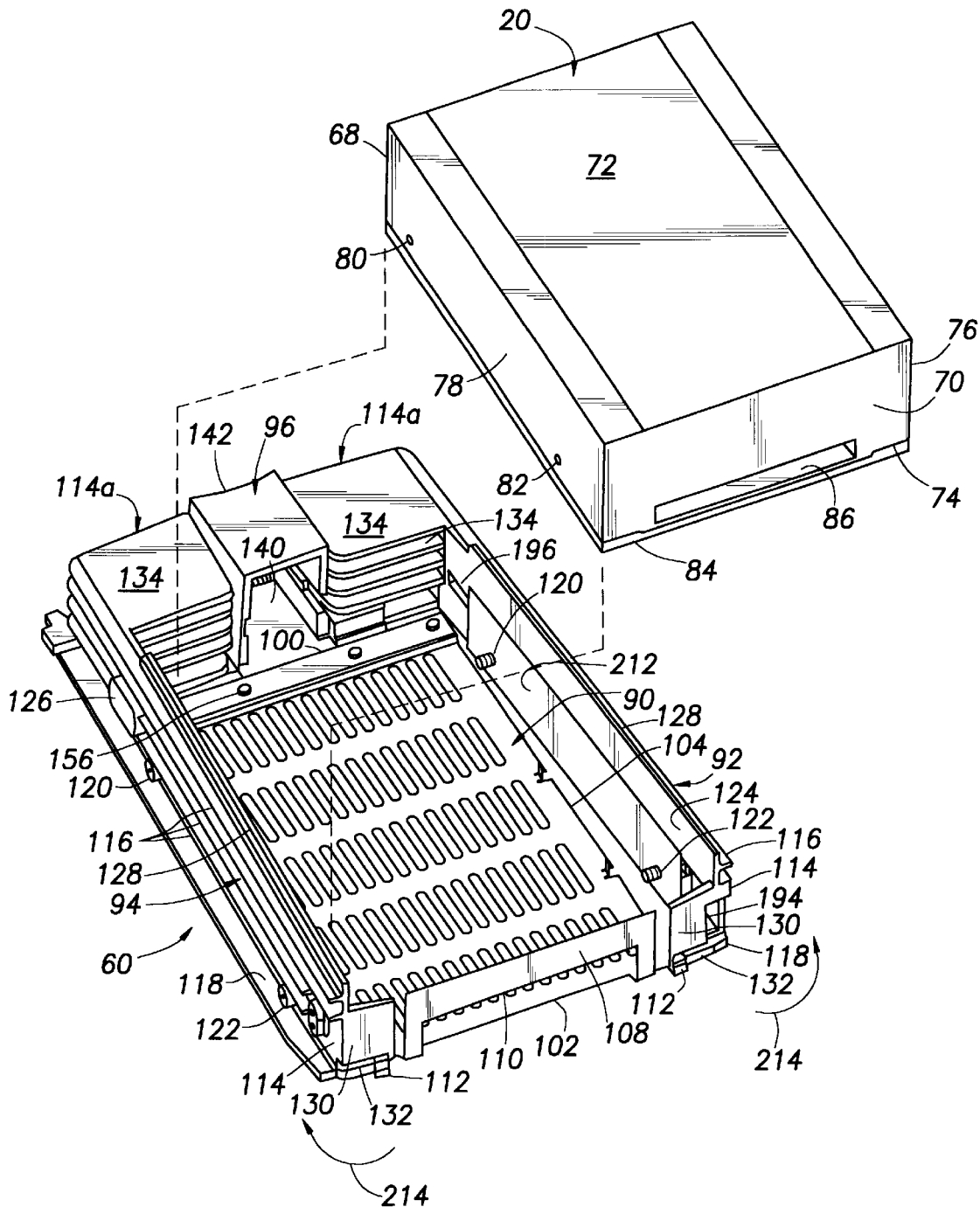
FIG. 10 is an enlarged scale exploded top, rear and right side perspective view of the removed disk drive/carrier assembly, with opposite heat sink wall portions of the carrier being pivoted outwardly to their disk drive release positions relative to a base wall portion of the carrier, and portions of the assembly having been removed for purposes of illustrative clarity.
Figure 15:
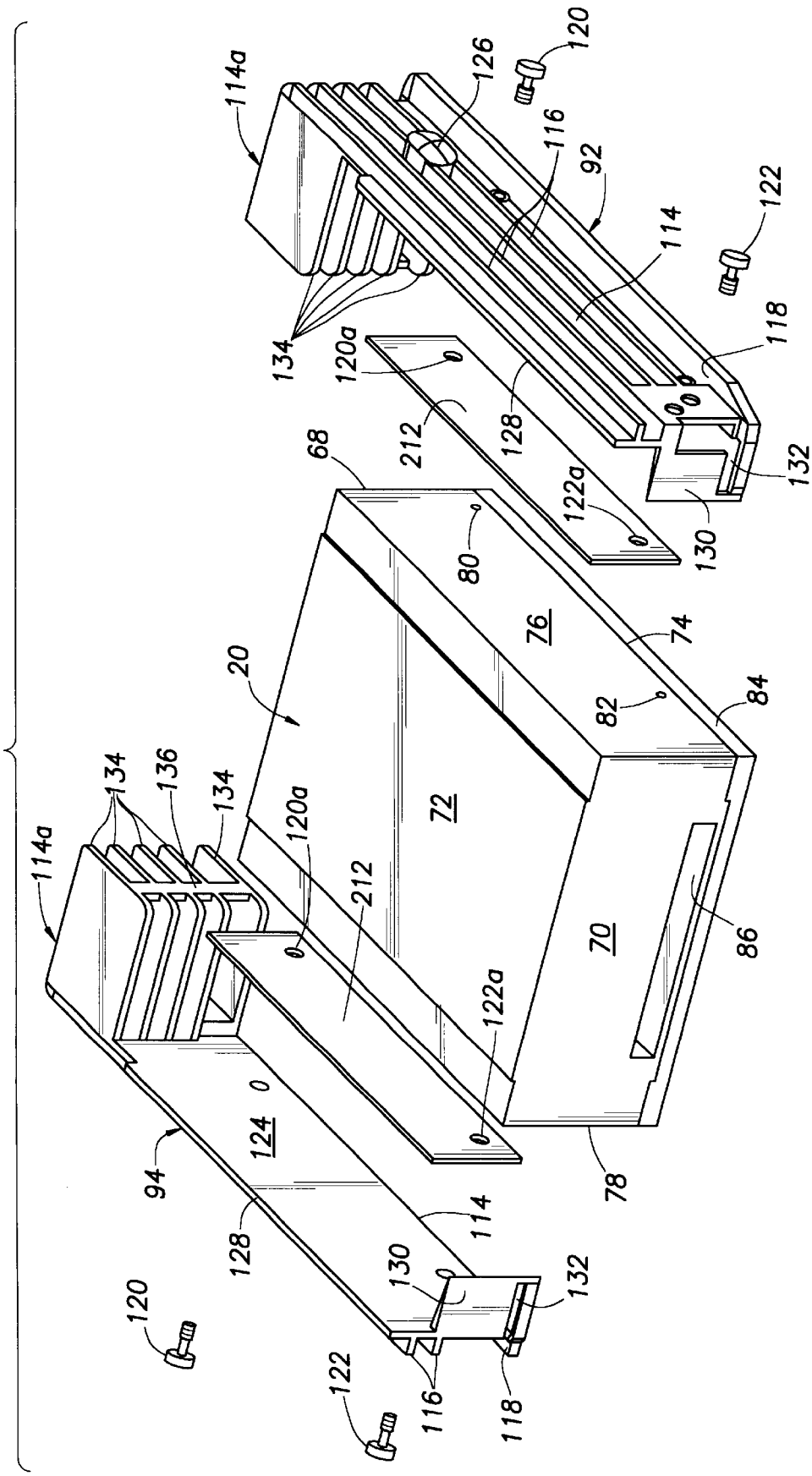
FIG. 15 is an enlarged scale partial exploded perspective view of the removed disk drive/carrier assembly and illustrates a heat sink support structure feature thereof.

Referring now to FIGS. 10 and 15, each of the carriers 60 also includes a pair of thermally conductive resilient heat transfer interface pad members 212 having horizontally elongated configurations. Pads 212 are adhered to the inner sides 124 of the side wall body sections 114, with the left pad 212 being mounted over the groove 196 in the left body section 114. Holes 120a,122a are formed in the pads 212 to permit passage of the captively retained mounting screws 120,122 therethrough.

Use and Operation of the Carriers 60

The operation, use and various advantages of the disk drive carriers 60 will now be described in detail with initial reference to FIGS. 10 and 11. To ready one of the carriers 60 for operative supporting connection to one of the hard disk drives 20, the rear ends of the left and right side wall heat sink structures 92,94 are pivoted outwardly away from one another and the opposite left and right side edges 104,106 of the base wall 90, as indicated by the arrows 214 in FIG. 10, to thereby increase the distance between the inner side surfaces 124 of the body sections 114. The two side wall portions 92,94 pivot horizontally about the vertical shouldered screws 162 at the front of the carrier 60 (see FIG. 11A), with the engagement of the rear corner tabs 112 with the inner end surfaces of the tab slots 132 serving to limit the extent of this outward pivoting.

The disk drive 20 is then simply placed atop the base wall 90 so that the disk drive threaded mounting holes 80,82 are aligned with the front and rear mounting screws 120,122 captively retained on the left and right side wall structures 92 and 94. The side walls 92 and 94 are then pivoted back toward one another to their positions shown in FIGS. 4 and 5 in which they are parallel to the left and right side edges of the base wall 90. Finally, the mounting screws 120,122 are simply screwed into the corresponding opposing disk drive side openings 80 and 82.

This simple procedure securely mounts the disk drive 20 in the carrier 60 in a manner such that the bottom, opposite sides and opposite ends of the mounted disk drive are shielded by portions of the carrier structure against user hand contact with the mounted disk drive, while at the same time providing an appreciable degree of ESD shielding for the disk drive 20. The completed disk drive/carrier assembly 20,60 may then be operatively inserted into the cage 24 (see FIG. 2) as later described herein.

When the disk drive/carrier assembly 20,60 is subsequently withdrawn from the cage 24, the removal of the disk drive 20 from its carrier is effected simply by unscrewing the mounting screws 120,122 from the disk drive 20, pivoting the carrier side wall structures 92,94 outwardly to their FIG. 10 release positions to facilitate removal of the disk drive, and then simply lifting the now freed disk drive 20 off of the top side of the base wall 90.

As can readily be seen, both the installation of the disk drive 20 on its associated carrier 60, and the subsequent removal of the disk drive 20 from its carrier 60, can be carried out without the removal of any portion of the carrier 60 from the balance thereof. This is due to the unique "no loose parts" construction of the carrier 60 in which all of its components are captively carried by the balance of the carrier. Specifically, the front ends of the side wall structures 92,94 are captively and movably retained on the bezel 96, the rear ends of the side wall structures 92,94 are captively and movably retained on the base wall 90, the bezel 96 is captively retained on the base wall 90, the latch assembly 98 is captively and movably retained on the bezel 96 and the right side wall structure 94, and the mounting screws 120, 122 are captively and movably retained on the left and right carrier side wall portions 92 and 94. In this manner the potential for losing, misplacing or potentially damaging portions of carrier 60 in conjunction with mounting the disk drive on an associated carrier, or removing the disk drive therefrom, is substantially eliminated.

Figure 16:
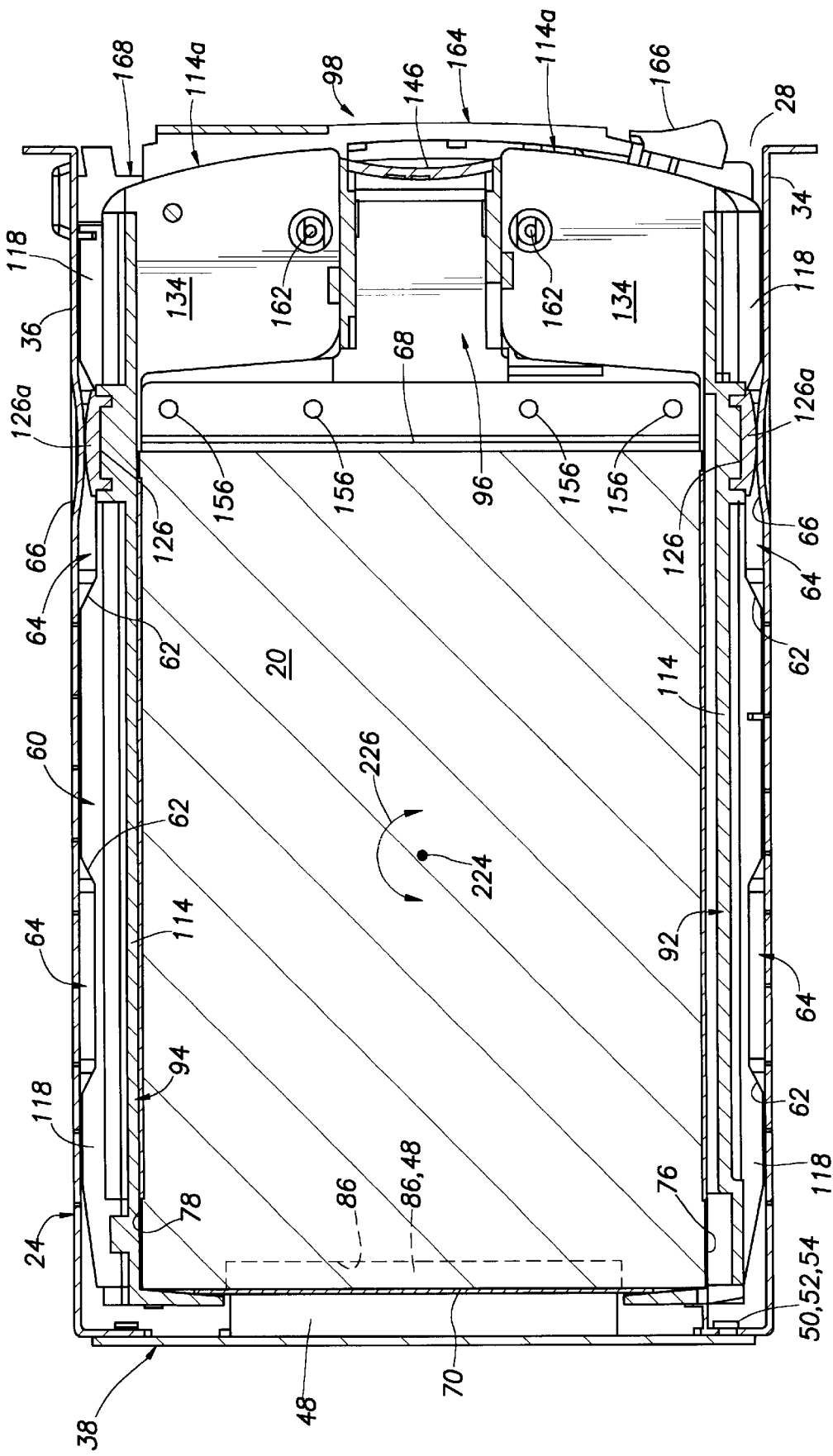
FIG. 16 is an enlarged scale cross-sectional view through one of the cage-supported disk drive/carrier assemblies taken along line 16—16 of FIG. 2.

Each of the disk drive/carrier assemblies may be operatively installed within the interior of the cage 24 (see FIG. 2) by simply sliding the carrier mounting flanges 118 rearwardly into the appropriate opposing pairs of cage guide rail sections 64 (see FIGS. 3, 16 and 18), and then using the carrier's ejector latch assembly 98 to releasably mate, in a hot-plugged manner, the disk drive's rear-mounted SCA connector 86 (see FIGS. 10 and 15) with a facing one of the backplane connectors 48 (see FIGS. 2 and 16). The operation of the specially designed ejector latch assembly 98 will now be described with reference to FIGS. 11–13A.

Figure 11:
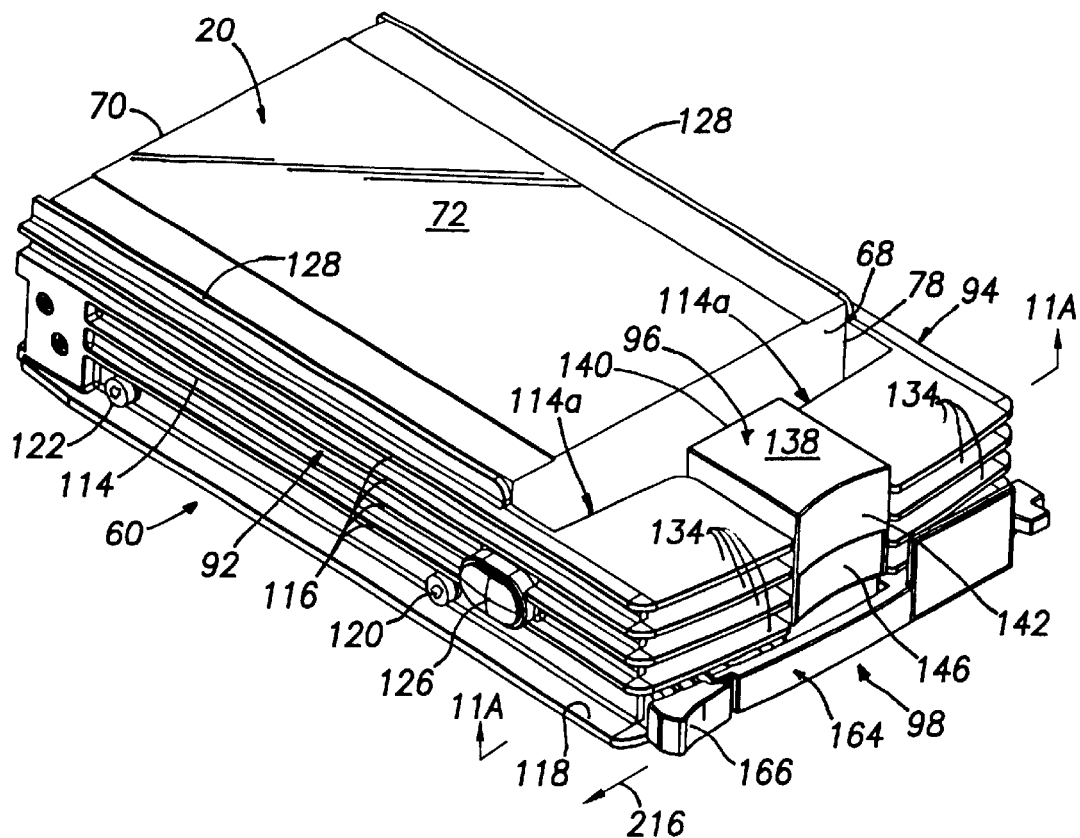
Figure 11A:
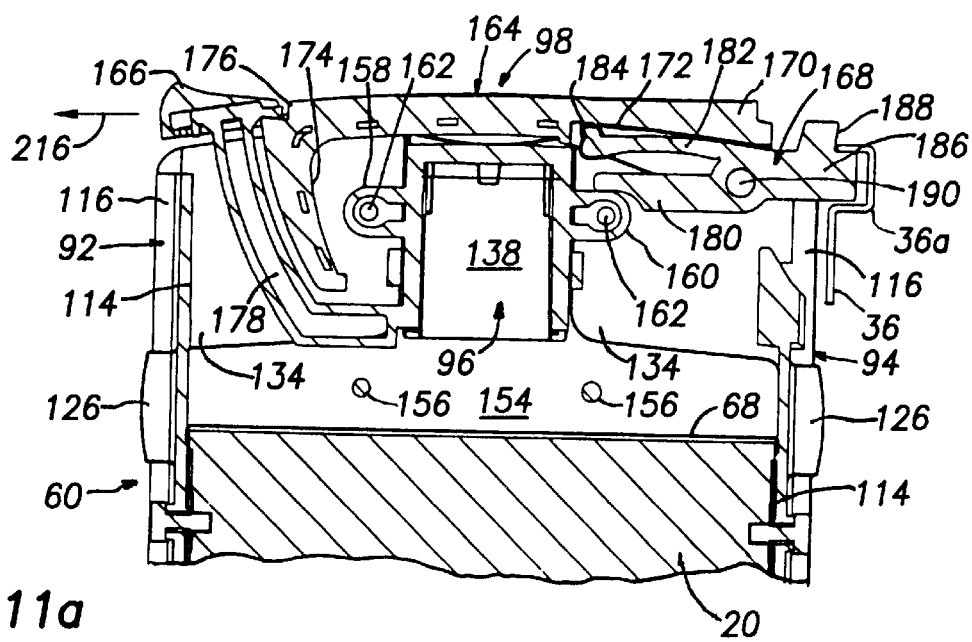

One of the disk drive/carrier assemblies 20,60 is shown in FIGS. 11 and 11A with its ejector latch assembly 98 in its fully closed, locked position to which it is moved, after the carrier 60 is slid into the cage 24, to mate the disk drive/backplane connector pair 86,48 and releasably lock the disk drive/carrier assembly 20/60 in its operative position within the cage 24. As illustrated, with the ejector latch assembly 98 in this position, the ejector lever member 164 longitudinally extends in a left-to-right direction and is compactly positioned closely adjacent the front side of the central bezel section 138, with the inturned outer end portion 174 of the lever member 164 being received between the lowermost pair of heat sink fins 134 on the left front corner of the carrier 60.

The outer end of the inner side arm 180 of the bifurcated spring member 168 is in abutment with the boss 160, and the outer side arm 182 is received within the inner side recess 172 of the outer side arm 182. The outer end projection 184 of the outer side arm 182 is engaging the front side surface of the recess 172 in a manner rearwardly bending the outer side arm 182, thereby exerting a resilient forward pivotal biasing force on the ejector lever member 164. The forwardly biased ejector lever member 164 is prevented from forwardly pivoting away from its fully closed position shown in FIGS. 11 and 11A by the retainer slide member 166, a portion of which forwardly overlies the outer side notch area 176 at the outer end of the lever member 164 and releasably blocks forward pivoting of the lever member 164 relative to the front end of the carrier 60. As illustrated, the inner or right end 186 of the bifurcated spring member 168, adjacent the notch 188 therein, is received within an immediately adjacent vertical channel portion 36a of the right side wall 36 of the cage 24 (see FIG. 2).

When it is desired to remove the inserted disk drive/carrier assembly 20,60 from the interior of the cage 24, and unplug the disk drive connector 86 from its associated backplane connector 48, the user simply moves the retainer slide member 166 leftwardly, as indicated by the arrows 216 in FIGS. 11 and 11A, thereby leftwardly bending the spring arm structure 178 and shifting the retainer slide member 166 out of overlying, blocking engagement with the left end of the ejector lever member 164.

Figure 12:
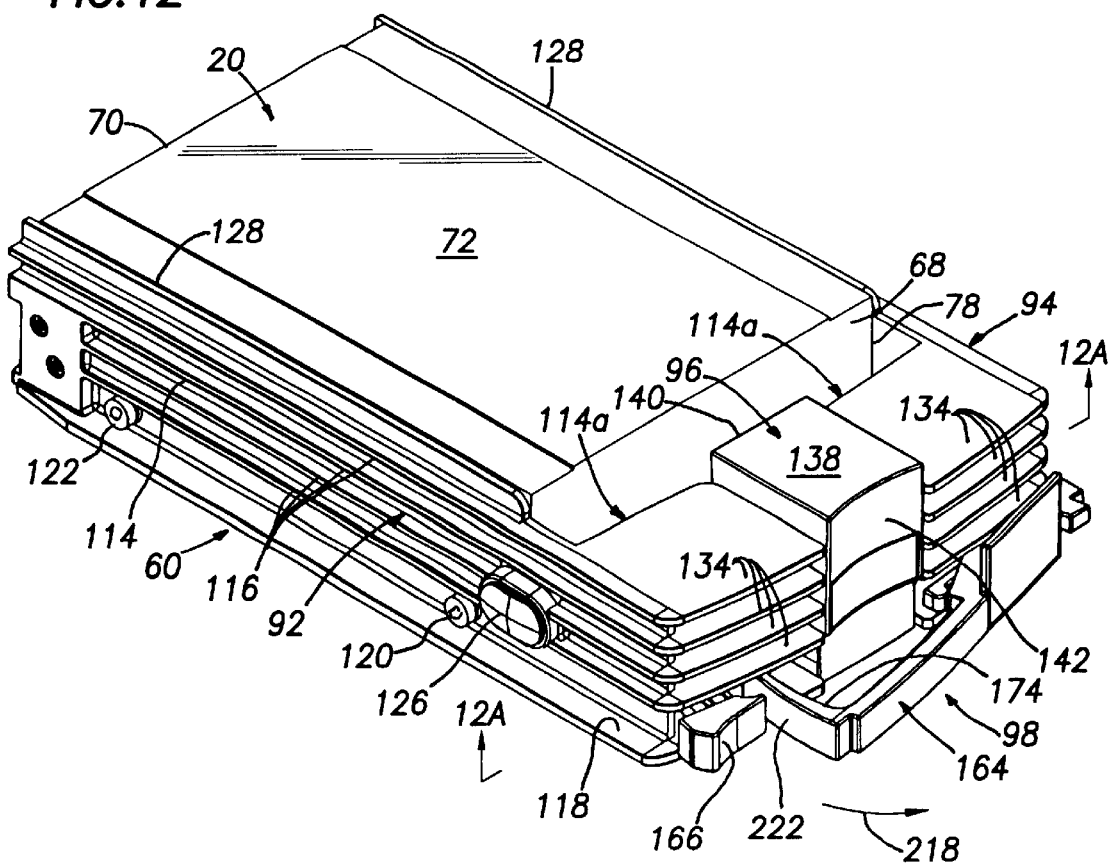
Figure 12A:
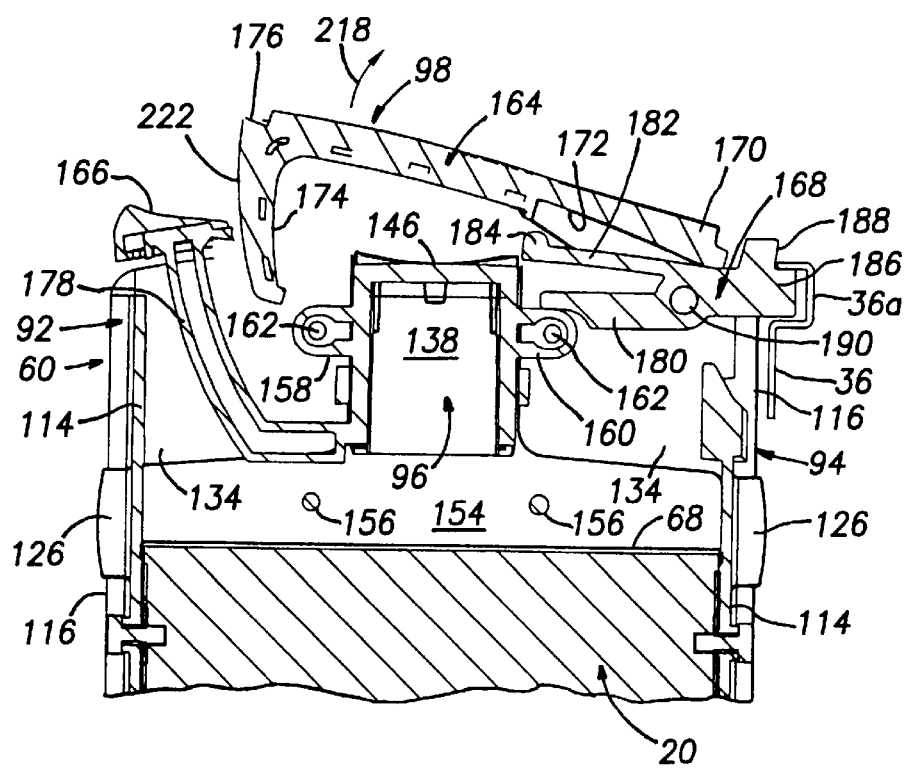

This permits the previously deformed outer side arm 182 to forwardly pivot the ejector lever member 164 out to an intermediate position thereof (see FIGS. 12 and 12A) as indicated by the arrows 218 in FIGS. 12 and 12A. The pivotal movement of the lever member 164 from its fully closed position to its intermediate position does not unplug the disk drive connector 86 from its associated backplane connector 48, but exposes the juncture of the elongated main lever body and its inturned outer end portion 174 to present a convenient pull handle structure to the user which he may grasp and pull forwardly with one hand.

Figures 13, 13A:
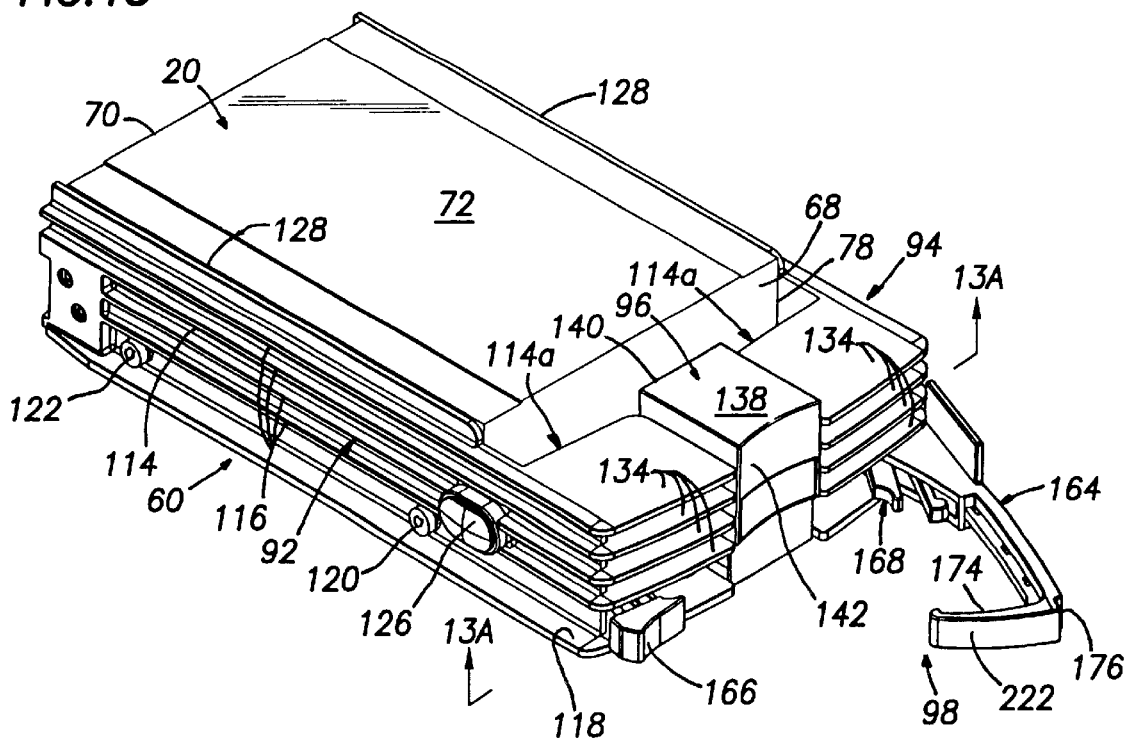

By manually pulling in a forward direction on the lever member 164 in its intermediate position shown in FIGS. 12 and 12a, the lever member is forwardly pivoted outwardly to an opened position thereof shown in FIGS. 13 and 13a. This movement of the lever member 164 to such opened position drives the inner end 186 of the bifurcated spring member 168 rearwardly against the vertical cage channel section 36a (see FIG. 13A) to forwardly drive the carrier 60 relative to the cage 24, as indicated by the arrow 220 in FIG. 13A, to decouple the disk drive connector 86 from its associated backplane connector 48. A further forward manual pull on the lever member 164 pivots the inner spring member end 186 out of leveraged engagement with the vertical cage channel section 36a and pulls the disk drive/carrier assembly 20,60 out of the cage 24.

This process is simply reversed to easily and quickly install one of the disk drive/carrier assemblies 20,60 in the interior of the cage 24. Specifically, with the lever member 164 in its fully opened position the carrier mounting flanges 118 (see FIGS. 10, 16 and 18) are slid rearwardly into opposing pairs of the cage guide rail structures 64 (see FIGS. 3, 16 and 18) until the inner end 186 of the bifurcated spring member 168 is adjacent the vertical channel section 36a (see FIG. 13A). Lever member 164 is then rearwardly pivoted through its FIG. 13A opened position and its FIG. 12A intermediate position to its FIG. 11A locked position.

Via the leveraged interaction between the inner end 186 of the bifurcated spring member 168 and the vertical cage channel section 36a this drives the disk drive/carrier assembly 20,60 further rearwardly relative to the cage 24 to couple the disk drive connector 86 and its associated backplane connector 48 as the lever member 164 is rearwardly pivoted from its FIG. 13A position to its FIG. 12A position. As the lever member 164 is further pivoted from its FIG. 12A position to its FIG. 11A closed position, the lever member 164 engages and rearwardly bends the outer spring side arm 182, and the curved outer side surface 222 of the lever member outer end portion 174 engages and leftwardly cams the retainer slide member 166 (thus leftwardly bending the spring arm structure 178) to permit the lever member end portion 174 to enter the space between the two lowermost heat sink fins 134 on the left front corner of the carrier 60. upon entry of the lever end portion 174 into this space, the resiliently deformed spring arm structure 178 causes the retainer slide member 166 to snap rightwardly back into the outer end notch 176 of the lever member 164 to releasably retain the lever member 164 in its closed position, shown in FIGS. 11 and 11A, against the forward pivotal biasing force of the resiliently deformed outer side arm 182 of the bifurcated spring member 168.

As can be seen from the foregoing, the overall ejector latch assembly 98 is of a simple, relatively inexpensive construction, and is easily useable with one hand, in a quite intuitive manner, to latch and unlatch the carrier 60 to and from the cage 24 and couple and decouple the connector pair 48,86. The ejector latch assembly 98 in its closed orientation is also quite compact, but opens outwardly to define an easily graspable pull handle structure. While the ejector latch assembly 98 has been illustrated as being associated with a disk drive structure it could be alternatively utilized with a variety of other types of pluggable devices such as, by way of example, circuit boards and CD ROM drives.

In addition to its no-loose-parts construction and its improved ejector latch assembly, the carrier 60 is provided with several other advantages over conventionally configured carrier structures used to operatively support disk drives in support housings such as sheet metal cages. One of these additional advantages is the provision of substantially improved dissipation of disk drive operating heat. As will be recalled, the pivotable opposite side wall portions 92,94 of the carrier 60 are configured as heat sink structures, having integral fin portions 116,134 thereon. When one of the disk drives 20 is supported on its carrier 60 within the cage 24 (see FIG. 2), the operation of the fan 42 draws cooling air 44 inwardly through the front carrier fins 134 and along the supported disk drive, and inwardly through the cage ventilation holes 40 along the disk drive 20 and the carrier side wall cooling fins 116 to convectively dissipate disk drive operating heat from the disk drive/carrier assembly 20,60.

This convective heat dissipation is very substantially augmented by the provision of the heat conductive thermal interface pad members 212 (see FIGS. 10 and 15) which are compressed between the carrier side wall members 92,94 and the facing left and right sides 76,78 of the disk drive 20. The use of these pads 212 substantially increases the conductive heat transfer between the supported disk drive and the heat sink side wall portions 92,94 of the carrier 60 to thereby increase the overall disk drive operating heat transfer to the cooling flow of air 44 rearwardly through the interior of the support cage structure 24.

Another advantage of the carrier structure 60 is the manner in which it provides a visual indication of the operational state of the disk drive 20 that it removably supports within the cage 24. When the disk drive 20 is hot plug-connected to its associated backplane connector 48 within the cage 24, the circuitry associated with the drive 20 (i.e., the electronics on its underlying circuit board portion 84) activates the three LED indicating lights 50,52,54 leftwardly adjacent the backplane connector 48 (see FIGS. 2 and 14) in accordance with the operational state of the disk drive 20. When any of the three indicating lights 50,52,54 is activated, its light output is received by the optical connector 192 on the left rear corner of the carrier 60 and transmitted via the associated one of the three fiber optic cables 198, 200,202 to the lens structure 204 at the front of the carrier 60 and then to the associated one of the three drive operating icons 148,150,152 via one of the lens sections 206,208,210 disposed in a central front end portion of the carrier 60.

The unique positioning of the light transmitting elements 200,202,204 within the interior of the carrier 60, as opposed to being routed externally along the outer side thereof or on the cage structure 24, provides this transfer of the LED indicating light signals without increasing the outer spatial envelope of the carrier 60 or adding the complexity of placing the transfer elements on the cage structure. Additionally, due to the use of fiber optic cables as the light transmitting elements, neither the required bends in the elements to accommodate the central placement of the operating icons 148,150,152 nor the length of the transmitting element runs from the LED lights 50,52,54 to the operating icons 148,150,152 appreciably diminishes the light output intensity at the operating icons.

Illustratively, the hard disk drives 20 supported by the carriers 60 are high speed drives that operate in the 7,200 RPM to 12,000 RPM rotational speed range. This speed range refers to the rotational speed range of the platter portion of each drive around a rotational axis 224 of the drive (see FIG. 16) which is transverse to the base wall 90 of the carrier 60. As is well known, this high rotational speed tends to cause self-induced rotational vibration of the drive about the axis 224 as indicated by the double-ended arrow 226 in FIG. 16. If not suitably controlled, this rotational vibration 226 about the axis 224 can substantially degrade the performance of the supported disk drive 20.

Conventional approaches to controlling this self-induced operational vibration have included placing resilient vibration absorbing structures between the disk drive and its associated carrier, or simply increasing the size and mass of the carrier to better absorb this operational vibration of the disk drive. Neither of these previously proposed approaches has proven to be entirely satisfactory, the separate resilient shock absorbing system being an additional source of undesirable size, complexity and cost, and the increased size and mass of the carrier undesirably increasing he overall size of the stacked disk drive array.

In the specially designed carrier 60, however, the self-induced rotational vibratory forces of its supported hard disk drive 20 about the axis 224 are very substantially reduced by using the two boss structures 126 on opposite sides of the carrier 60 (see FIGS. 16 and 17) to create on the cage-inserted carrier 60 two oppositely disposed interference fits between the boss structures 126 and the lanced-in carrier side wall portions 66 in response to insertion of the carrier 60 into the cage 24 as previously described herein.

These opposite interference fits between the cage 24 and the carrier 60 are offset in a front-to-rear direction relative to the rotational axis 224 of the supported hard disk drive 20. Preferably, as shown in FIG. 16, such opposed interference fit locations are forwardly offset from the rotational axis 224, but could alternatively be rearwardly offset therefrom. Because of this offset of the two opposed interference fit locations from the rotational axis 224 it can be seen that the cage 24 serves to strongly impede vibration induced rotation of the disk drive 20 in either direction about the drive's rotational axis 224. The bosses 126 can be simply be integral metal portions of the cage side wall sections 92 and 94 or, as indicated in FIG. 16, be partially defined by suitable nonmetallic inserts 126a supported in base portions of the bosses 126.

Another potential source of damage to the disk drives 20 arises from what is commonly referred to as non-operational shock damage. This type of shock damage to one of the carrier-supported disk drives 20 can arise when the carrier is removed from the cage 24 and placed on a horizontal work surface such as a table or work bench. For example, if the removed carrier accidentally slips out of a technician's hand and falls only a short distance onto the surface, or is placed on edge on the surface and then tips over onto the surface, the carrier-supported drive can be damaged from this type of non-operational shock.

In previously utilized, relatively low speed disk drives stacked in relatively low density arrangements, the non-operational shock problem was dealt with by placing resilient shock absorbing foot structures on the bottom sides of the drive carriers. Thus, if the carrier fell a short distance or tipped over onto a horizontal support surface, the feed absorbed the resulting non-operational shock and prevented resulting damage to the carrier-supported disk drive. However, with the growing trend toward stacking carrier supported disk drives in increasingly dense arrays, the additional stacking space required by even these small resilient shock-absorbing feet came to be unacceptable, with the result being that many computer manufacturers simply eliminated such feet and relied on labels placed on the disk drives and warning users of the drives to handle them very carefully to avoid non-operational shock damage thereto.

In the specially designed carrier 60, however, the configurations of the disk drive/carrier assemblies 20,60 are related to one another in a unique manner permitting the previously described vibration isolation feet 137a,137b (see FIGS. 5–9, 17 and 18) to be placed on the bottom sides of the carriers 60 without appreciably increasing the overall stack height of a stacked array of disk drive/carrier assemblies 20,60 within the cage structure 24.

Specifically, as best illustrated in FIG. 18, each disk drive/carrier assembly 20,60 is configured in a manner such that the top side edges of the top edge flanges 128 on the left and right carrier side wall structures 92,94 are downwardly offset from the top side of the disk drive 20 supported in the carrier 60 to thereby create in the assembly 20,60 front-to-rear extending depressed areas 228 (see FIGS. 17 and 18) outwardly adjacent top right and left corner portions of the supported disk drive 20.

These depressed areas 228 define what may be termed nesting areas that downwardly receive the resilient support feet 137a,137b on the bottom side of the upwardly adjacent carrier 20. For example, the support feet 137a,137b on the bottom side of the upper disk drive/carrier assembly 20,60a shown in FIGS. 17 and 18 downwardly nest in the opposite top corner depressed areas 228 of the lower disk drive/carrier assembly 20,60b, with the bottom sides of the support feet 137a,137b on the upper disk drive/carrier assembly 20,60a being downwardly offset from the top side of the top side of the lower disk drive 20. Thus, in each vertically successive pair of disk drive/carrier assemblies 20,60 the resilient shock absorbing feet 137a,137b in the upper assembly are received and nest within the outer spatial envelope of the lower assembly so that the desirable presence of the shock absorbing feet 137a,137b does not appreciably increase the stack height of the multi-disk drive array. While this unique nesting of the support feet has been representatively illustrated and described in conjunction with a vertically stacked array of carrier-supported disk drives, it will be readily appreciated that it could also be utilized to advantage in conjunction with a horizontally stacked array of carrier-supported disk drives as well.

The foregoing detailed description is to be clearly understood as being given by way of illustration and example only, the spirit and scope of the present invention being limited solely by the appended claims.

What is claimed is:

1. Heat dissipating apparatus for supporting a heat-generating device within a housing structure, said heat dissipating apparatus comprising:

a body configured to support the heat-generating device and being removably insertable therewith into the housing structure;

said body having a thermally conductive heat sink portion being movable toward and away from the heat-generating device the heat sink portion comprising at least a spaced apart first and second heat sink wall structure captively retained on to the balance of said body and moving relative thereto toward and away from opposite sides of the heat generating device;

a resilient, heat conductive thermal interface structure positionable between the heat-generating device and said heat sink portion; and a fastening structure operative to removably secure said heat sink portion to the heat-generating device, in a manner compressing said thermal interface member between and directly against said heat sink portion and the device.

2. The heat dissipating apparatus of claim 1 wherein said body is configured to support a hot-pluggable hard disk drive.

3. The heat dissipating apparatus of claim 1 wherein said heat sink portion has a finned configuration.

4. The heat dissipating apparatus of claim 1 wherein said fastening structure is captively retained on said heat sink portion for movement relative therewith relative to the balance of said body.

5. The heat dissipating apparatus of claim 1 wherein:

said resilient, heat conductive thermal interface structure includes first and second resilient, heat conductive thermal interface pads respectively carried by said first and second heat sink wall structures; and said fastening structure includes fastening members captively retained on said first and second heat sink wall structures.

6. Disk drive apparatus removably supportable within a housing structure through which cooling air may be flowed, said disk drive apparatus comprising:

a hot-pluggable disk drive;

a carrier structure for supporting said disk drive and being removably insertable therewith into the housing structure to a supported operating position therein, said carrier structure having:

spaced apart first and second thermally conductive heat sink wall structures positionable on opposite sides of the supported disk drive and being captively retained on the balance of said carrier structure for movement relative thereto toward and away from opposite portions of the supported disk drive, resilient heat conductive thermal interface pads secured to said first and second heat sink wall structures for movement therewith, and fastening members captively retained on said first and second heat sink wall structures and being operative to releasably secure them to the opposite sides of the supported disk drive in a manner compressing said thermal interface pads between and directly against said first and second heat sink wall structures and the opposite sides of the supported disk drive.

7. The disk drive apparatus of claim 6 wherein said hot-pluggable disk drive is operatively supported on said carrier structure.

8. The disk drive apparatus of claim 6 wherein:

said carrier structure further has a base wall upon which said hot-pluggable disk drive may be placed, said base wall having opposite front and rear end portions, and opposite side edge portions extending between said front and rear end portions, said first and second heat sink wall structures have side portions to which said thermal interface pads are secured, said heat sink wall structure side portions extending generally along said opposite edge portions of said base wall and being positionable on opposite sides of the supported disk drive, said first and second heat sink wall structures further having front end portions pivotally secured to said front end portion of said base wall.

9. The disk drive apparatus of claim 8 wherein said front end portions of said first and second heat sink wall structures have spaced apart fin portions defining cooling air flow passages therebetween.

10. The disk drive apparatus of claim 6 wherein:

said apparatus further comprises a support housing through which cooling air may be flowed, said hot-pluggable disk drive is operatively supported on said carrier structure, and said carrier structure is removably supported in said housing structure.

11. The disk drive apparatus of claim 10 further comprising means for forcing a flow of cooling air through said housing structure to dissipate operating heat from said hot-pluggable disk drive.

12. Disk drive apparatus removably supportable within a housing structure through which cooling air may be flowed, said disk drive apparatus comprising:

a hot-pluggable disk drive;

a carrier structure for supporting said disk drive and being removably insertable therewith into the housing structure to a supported operating position therein, said carrier structure having:

spaced apart first and second thermally conductive heat sink wall structures positionable on opposite sides of the supported disk drive and being captively retained on the balance of said carrier structure for movement relative thereto toward and away from opposite portions of the supported disk drive and wherein said first and second heat sink wall structures are pivotally secured to the balance of said carrier structure, resilient heat conductive thermal interface pads secured to said first and second heat sink wall structures for movement therewith, and fastening members captively retained on said first and second heat sink wall structures and being operative to releasably secure them to the opposite sides of the supported disk drive in a manner compressing said thermal interface pads between and directly against said first and second heat sink wall structures and the opposite sides of the supported disk drive.

13. The disk drive apparatus of claim 12 wherein said first and second heat sink wall structures have finned configurations.

14. Disk drive apparatus removably supportable within a housing structure through which cooling air may be flowed, said disk drive apparatus comprising:

a hot-pluggable disk drive;

a carrier structure for supporting said disk drive and being removably insertable therewith into the housing structure to a supported operating position therein, said carrier structure having:

spaced apart first and second thermally conductive heat sink wall structures positionable on opposite sides of the supported disk drive and being captively retained on the balance of said carrier structure for movement relative thereto toward and away from opposite portions of the supported disk drive and wherein said first and second heat sink wall structures have side portions to which said thermal interface pads are secured, said heat sink wall structure side portions extending generally along said opposite edge portions of said base wall, being positionable on opposite sides of the supported disk drive and having rear ends, said first and second heat sink wall structures further having front end portions pivotally secured to said front end portion of said base wall, resilient heat conductive thermal interface pads secured to said first and second heat sink wall structures for movement therewith, fastening members captively retained on said first and second heat sink wall structures and being operative to releasably secure them to the opposite sides of the supported disk drive in a manner compressing said thermal interface pads between and directly against said first and second heat sink wall structures and the opposite sides of the supported disk drive, a base wall upon which said hot-pluggable disk drive may be placed, said base wall having opposite front and rear end portions, and opposite side edge portions extending between said front and rear end portions, and cooperatively engaged structures, disposed on said base wall and said rear ends of said side portions of said first and second heat sink wall structures, which are operative to permit only a limited amount of pivotal motion of said first and second heat sink wall structures and said base wall.

15. A computer system comprising a CPU unit having a microprocessor and a data storage section operative to store data retrievable by said microprocessor, said data storage section comprising:

a housing structure through which cooling air may be flowed;

a data storage device; and a body configured to support said data storage device and being removably insertable therewith into said housing structure to a supported operating position therein;

said body having a thermally conductive heat sink portion positionable in the cooling air flow path within said housing structure, the heat sink portion being captively retained on the balance of said body and moving relative thereto toward and away from the supported data storage device;

a resilient, heat conductive thermal interface structure positionable between the supported data storage device and said heat sink portion; and a fastening structure operative to removably secure said heat sink portion to the supported electronic device, in a manner compressing said thermal interface member between and directly against said heat sink portion and the device, to conductively receive operating heat from the device for dissipation from said heat sink portion to cooling air being flowed through said housing structure.

16. The computer system of claim 15 wherein said data storage device is a hot-pluggable hard disk drive.

17. The computer system of claim 15 wherein said heat sink portion has a finned configuration.

18. The computer system of claim 15 wherein said fastening structure is captively retained on said heat sink portion for movement relative therewith relative to the balance of said body.

19. The computer system of claim 15 wherein:

said heat sink portion includes spaced apart first and second heat sink wall structures;

said resilient, heat conductive thermal interface structure includes first and second resilient, heat conductive thermal interface pads respectively carried by said first and second heat sink wall structures; and said fastening structure includes fastening members captively retained on said first and second heat sink wall structures.

20. A computer system comprising a CPU unit having a microprocessor and a data storage section operative to store data retrievable by said microprocessor, said data storage section comprising:

a housing structure through which cooling air may be flowed;

a hot-pluggable disk drive;

a carrier structure for supporting said disk drive and being removably insertable therewith into the housing structure to a supported operating position therein, said carrier structure having:

spaced apart first and second thermally conductive heat sink wall structures positionable on opposite sides of the supported disk drive and being captively retained on the balance of said carrier structure for movement relative thereto toward and away from opposite portions of the supported disk drive, resilient heat conductive thermal interface pads secured to said first and second heat sink wall structures for movement therewith, and fastening members captively retained on said first and second heat sink wall structures and being operative to releasably secure them to the opposite sides of the supported disk drive in a manner compressing said thermal interface pads between and directly against said first and second heat sink wall structures and the opposite sides of the supported disk drive.

21. The computer system of claim 20 wherein said hot-pluggable disk drive is operatively supported on said carrier structure.

22. The computer system of claim 20 wherein:

said carrier structure further has a base wall upon which said hot-pluggable disk drive may be placed, said base wall having opposite front and rear end portions, and opposite side edge portions extending between said front and rear end portions, said first and second heat sink wall structures have side portions to which said thermal interface pads are secured, said heat sink wall structure side portions extending generally along said opposite edge portions of said base wall and being positionable on opposite sides of the supported disk drive, said first and second heat sink wall structures further having front end portions pivotally secured to said front end portion of said base wall.

23. The computer system of claim 22 wherein said front end portions of said first and second heat sink wall structures have spaced apart fin portions defining cooling air flow passages therebetween.

24. The computer system of claim 20 wherein:

said hot-pluggable disk drive is operatively supported on said carrier structure, and said carrier structure is removably supported in said housing structure.

25. The computer system of claim 24 further comprising means for forcing a flow of cooling air through said housing structure to dissipate operating heat from said hot-pluggable disk drive.

26. A computer system comprising a CPU unit having a microprocessor and a data storage section operative to store data retrievable by said microprocessor, said data storage section comprising:
 a housing structure through which cooling air may be flowed;
 a hot-pluggable disk drive;
 a carrier structure for supporting said disk drive and being removably insertable therewith into the housing structure to a supported operating position therein, said carrier structure having:
  spaced apart first and second thermally conductive heat sink wall structures positionable on opposite sides of the supported disk drive and being captively retained on the balance of said carrier structure for movement relative thereto toward and away from opposite portions of the supported disk drive and wherein said first and second heat sink wall structures are pivotally secured to the balance of said carrier structure,
  resilient heat conductive thermal interface pads secured to said first and second heat sink wall structures for movement therewith, and
  fastening members captively retained on said first and second heat sink wall structures and being operative to releasably secure them to the opposite sides of the supported disk drive in a manner compressing said thermal interface pads between and directly against said first and second heat sink wall structures and the opposite sides of the supported disk drive.

27. The computer system of claim 26 wherein said first and second heat sink wall structures have finned configurations.

28. A computer system comprising a CPU unit having a microprocessor and a data storage section operative to store data retrievable by said microprocessor, said data storage section comprising:
 a housing structure through which cooling air may be flowed;
 a hot-pluggable disk drive;
 a carrier structure for supporting said disk drive and being removably insertable therewith into the housing structure to a supported operating position therein, said carrier structure having:
  spaced apart first and second thermally conductive heat sink wall structures positionable on opposite sides of the supported disk drive and being captively retained on the balance of said carrier structure for movement relative thereto toward and away from opposite portions of the supported disk drive and having:
   side portions to which said thermal interface pads are secured, said heat sink wall structure side portions extending generally along said opposite edge portions of said base wall being positionable on opposite sides of the supported disk drive and having rear ends, and
   front end portions pivotally secured to said front end portion of said base wall,
  resilient heat conductive thermal interface pads secured to said first and second heat sink wall structures for movement therewith,
  fastening members captively retained on said first and second heat sink wall structures and being operative to releasably secure them to the opposite sides of the supported disk drive in a manner compressing said thermal interface pads between and directly against said first and second heat sink wall structures and the opposite sides of the supported disk drive,
  a base wall upon which said hot-pluggable disk drive may be placed, said base wall having opposite front and rear end portions, and opposite side edge portions extending between said front and rear end portions, and
  cooperatively engaged structures, disposed on said base wall and said rear ends of said side portions of said first and second heat sink wall structures, which are operative to permit only a limited amount of pivotal motion of said first and second heat sink wall structures and said base wall.

29. Heat dissipating apparatus for supporting a heat-generating device within a housing structure, said heat dissipating apparatus comprising:
 a body having a thermally conductive heat sink portion comprising heat sink wall structures movably and captively retained on the balance of said body for movement relative thereto toward and away from opposite sides of the heat-generating device.

30. The heat dissipating apparatus of claim 29 wherein said body is configured to support the heat-generating device and is removably insertable therewith into the housing structure.

31. The heat dissipating apparatus of claim 29 comprising a resilient, heat conductive thermal interface structure positionable between the heat-generating device and said heat sink portion.

32. The heat dissipating apparatus of claim 29 comprising a fastening structure operative to removably secure said heat sink portion to the heat-generating device.

33. The heat dissipating apparatus of claim 29 wherein said body is configured to support a hot-pluggable hard disk dive.

34. The heat dissipating apparatus of claim 29 wherein said heat sink portion has a finned configuration.

* * * * *